United States Patent [19]

Samarov et al.

[11] Patent Number: 5,315,480

[45] Date of Patent: May 24, 1994

[54] CONFORMAL HEAT SINK FOR ELECTRONIC MODULE

[75] Inventors: Victor M. Samarov, Carlisle; Ralph I. Larson, Jr., Bolton; George A. Doumani, No. Andover, all of Mass.

[73] Assignee: Digital Equipment Corporation, Maynard, Mass.

[21] Appl. No.: 54,458

[22] Filed: Apr. 28, 1993

Related U.S. Application Data

[63] Continuation of Ser. No. 792,127, Nov. 14, 1991, abandoned.

[51] Int. Cl.⁵ ............................................. H05K 7/20
[52] U.S. Cl. ..................................... 361/705; 174/252
[58] Field of Search ................ 174/163, 252; 361/383, 361/386-389; 165/185, 80.3

[56] References Cited

U.S. PATENT DOCUMENTS

| | | | |
|---|---|---|---|
| 3,179,854 | 4/1965 | Luedicke et al. | 361/386 |
| 4,999,741 | 3/1991 | Tyler | 361/387 |
| 5,045,972 | 9/1991 | Supan et al. | 361/387 |
| 5,097,387 | 3/1992 | Griffith | 361/385 |
| 5,166,864 | 11/1992 | Chitwood et al. | 361/387 |

FOREIGN PATENT DOCUMENTS

| | | | |
|---|---|---|---|
| 0246441 | 6/1987 | Fed. Rep. of Germany | 361/386 |
| 0059897 | 3/1989 | Japan | 361/387 |
| 1258488 | 12/1971 | United Kingdom | 361/388 |

OTHER PUBLICATIONS

Arnold et al, "Construction of a Liquid Metal Filled Module", IBM Tech Disc. Dul. vol. 22, No. 2, Jul. 1979, pp. 602–605.

*Primary Examiner*—Gregory D. Thompson
*Attorney, Agent, or Firm*—Albert P. Cefalo; Dirk Brinkman

[57] ABSTRACT

A system for cooling an electronic module in a computer system. In one embodiment of the invention, predetermined areas of the module, such as those exposed parts that carry electrical currents are covered with an conformable, electrically insulating layer. Thereafter, a second conformable, thermally conductive layer is formed on the first layer. In addition, surface expanding elements may be arranged on the first layer near devices particularly sensitive to heat before the application of the second layer.

3 Claims, 3 Drawing Sheets

CONFORMAL HEAT SINK FOR ELECTRONIC MODULE

This application is a continuation of application Ser. No. 792,127, filed Nov. 14, 1991 now abandoned.

FIELD OF THE INVENTION

This invention relates to cooling heat generating electronic devices, and more particularly to a system for cooling individual modules of electronic assemblies. This invention has a particular application and advantage when used in conjunction with cooling non-repairable, disposable electronic modules and will be described in connection with such use although other uses are contemplated.

BACKGROUND OF THE INVENTION

A very significant limitation on the operation and reliability of electronic devices is the efficient extraction of heat. Unless the devices are provided with an efficient heat transfer mechanism to maintain them within a predetermined operating temperature range, the speed, power, and useful life of the devices are severely limited. Excessive over-heating of electronic devices may cause their destruction.

The problem of heat removal from electronic circuit devices is increased when the devices are mounted on a thermally non-conductive substrate, such as an epoxy-glass printed circuit board. In a typical electronic module, the electronic devices are densely populated on the printed circuit board presenting a surface topology of varying heights, areas, and profiles.

It is a common approach in the cooling of heat generating electronic devices to provide each device requiring cooling with a poli-directional, or mono-directional localized heatsink. Thus, as shown in FIG. 1, an electronic module 10, includes a substrate 15 and heat generating devices 20 mounted on a surface 21 of the substrate 15. Heatsinks 30 are individually attached to the tops of the devices 20 for the purpose of dissipating heat. The drawbacks of such an approach is that the heatsinks 30 are of necessity limited in their footprints, must each be sized to conform to the geometry of the devices being cooled, must be aligned carefully with the device and are otherwise limited by the overall size of the system into which the module 10 is incorporated. It is tedious and expensive to adapt individually heatsinks to discrete heat generating devices which are diverse in placement and shape.

Alternatively, as shown in FIG. 2, heatsinks 30 have been provided for groups of localized devices 20 having similar dimensions. The main drawback of this approach is that it is a complex task to thermally mate the rigid heatsinks 30 with the devices 20. Generally, elastomeric compression pads, not shown, are required to ensure a good thermal contact between the heatsinks 30 and the devices 20. In addition, this method is not readily adaptable to multiple odd-shaped devices, and severely restricts the optimal layout of the devices 20 on the surface 21 of the substrate 15. Also, the relatively large weight of the assembled module 10 and the multiple screwholes required in the substrate 15 for attaching the heatsinks make this approach unattractive for mass-produced low-cost modules 10.

Yet another approach that has been used for cooling an electronic module 10 is shown in FIG. 3. In this arrangement a single heatsink 30 is in thermal contact with the opposite side of the substrate from the surface 15 on which the devices 20 are located. Although this scheme is fairly simple to assemble, it is less efficient in drawing heat from the devices 20 through the substrate 15, particularly if the devices 20 are surface mounted lacking leads protruding through the substrate 15 for conducting heat, or if the substrate 15 is made of a relative inexpensive material, for example, epoxy-glass, which has poor thermal conductive characteristics.

Accordingly, the known solutions for cooling an electronic module having varied heat generating devices mounted thereon increase the cost of assembly, and do not always provide for effective cooling of discrete and odd-shaped components.

Therefore, it is desirable to provide an apparatus and method for reliably cooling electronic modules with varied heat generating devices mounted thereon, which is simply to assemble, uses readily available inexpensive materials, and is easily adaptable to mass production methods.

SUMMARY OF THE INVENTION

In accordance with the invention, there is provided a system, that is a method and materials, for cooling individual heat generating devices mounted on the surface of an electronic module. More particularly, a substantially continuous, conformal first layer, including an electrically insulating material, is applied to the surface of the module on which the devices are mounted to a thickness to reliably cover the features of the devices, in particular those features which carry electrical currents. Thereafter, a substantially continuous second layer, including a thermally conductive material, is applied over the first layer. This second layer increases the heat transfer area and assists in spreading the heat over the surface of the entire module.

In one embodiment of the invention, the first layer, comprising, for example, a plastic, is applied by a vacuum wrapping technique to achieve tight conformance with the surface features of the module. The first layer is of a thickness sufficient to electrically isolate any electrically conductive surfaces of the module, but no so thick as to interfere with the dissipation of heat through the layer. The second layer, for example a metal, is applied by spraying or plating to a thickness to allow efficient heat conduction and spreading.

Also, if desired, surface-expanding elements, by way of example, fins are adhesively mounted to the first layer, in particular, above or near devices which are especially sensitive to excessive heat, before the application of the second layer.

These and other features and advantages of the present invention will become apparent from a reading of the detailed description in conjunction with the attached drawings in which like reference numerals refer to like elements in the several views.

DETAILED DESCRIPTION

Figure 1:
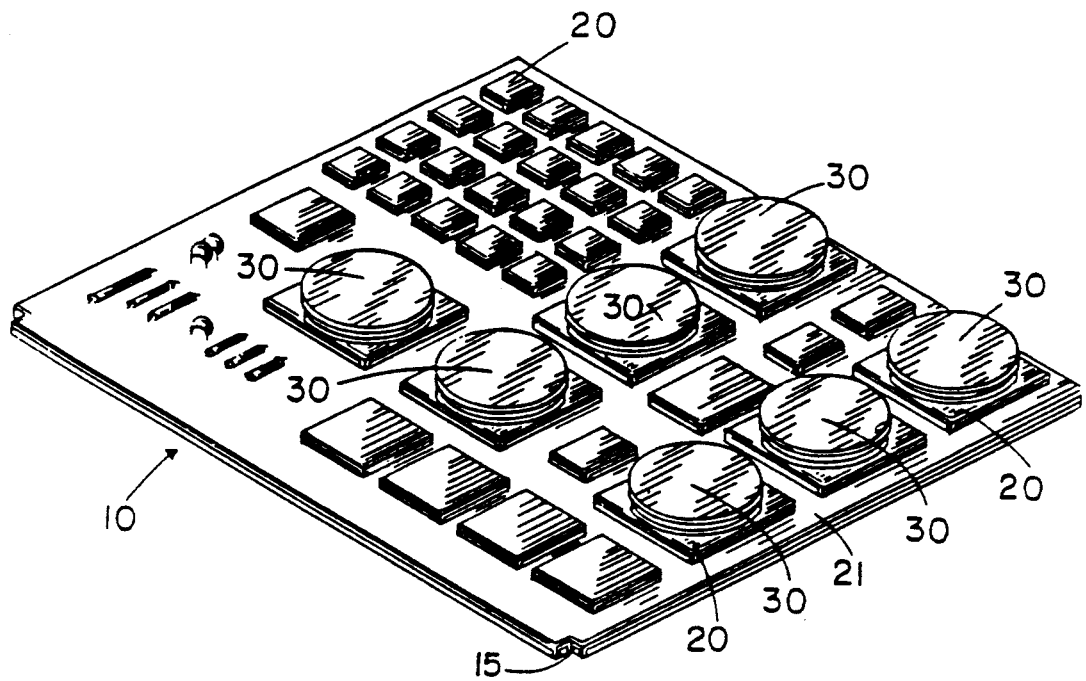
FIG. 1 is a perspective view of a conventional electronic module with heatsinks mounted on individual heat generating devices.
Figure 2:
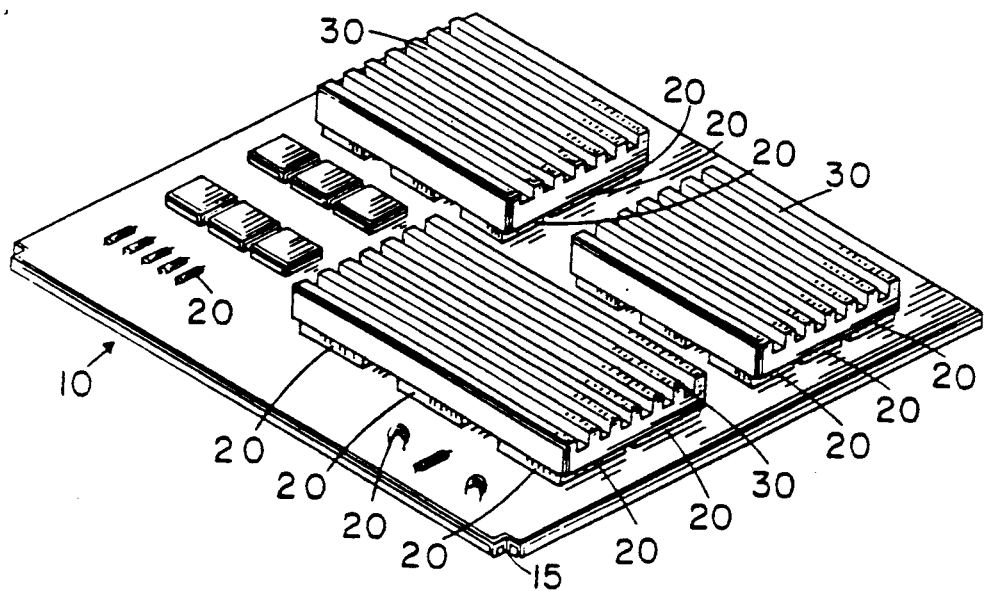
FIG. 2 is a perspective view of a conventional electronic module with heatsinks mounted on groups of heat generating devices.
Figure 3:
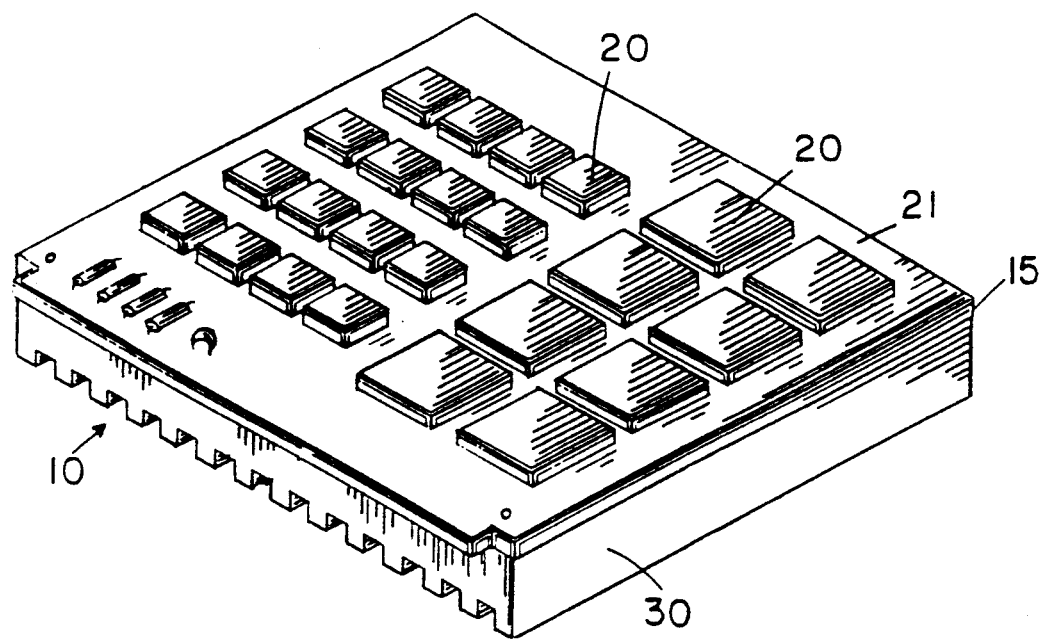
FIG. 3 is a perspective view of a conventional electronic module with a heatsink attached to one side thereof.
Figure 4:
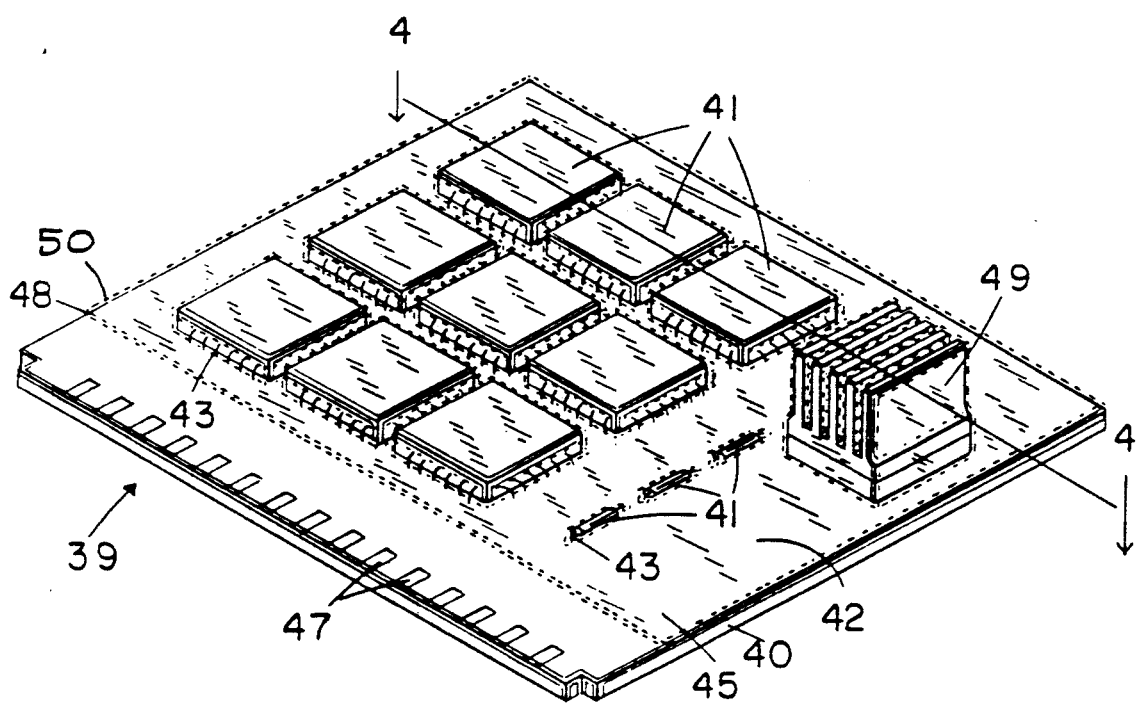
FIG. 4 is a perspective view of an electronic module using a cooling system according to the present invention.

FIG. 4 shows an electronic module 39 with components, including heat generating devices 41 mounted on one surface 42 of a substrate 40. The devices 41 are soldered to circuit traces, not shown, etched on, or in the substrate 40 by means of electrically conductive terminals 43. The circuits of the module 39 are electrically coupled to other modules of an electronic system by means of electrical contact points 47.

The operation of the module 39 produces heat which must be removed to prevent the failure or destruction of the devices 41. For mass-produced, non-repairable modules the substrate 39 is usually formed of an inexpensive dielectric material, for example, an epoxy-glass composite, having a high thermal impedance. Therefore, excessive heat is most conveniently removed directly from the devices 41.

Figure 5:
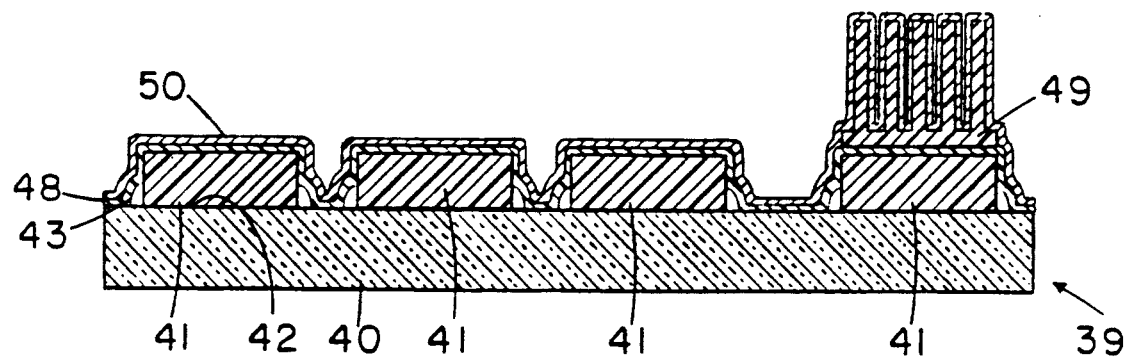
FIG. 5 is a cross-section of the electronic module of FIG. 4 along line 4—4.

To overcome the drawbacks of the prior art, the present invention shifts the task of heat removal from the individual components to a system for removing heat from the entire module. As shown in FIGS. 4 and 5, according to the invention, the surface 42 of the module 39 is coated with an effective thermally conductive coating without shorting the module's exposed electrical signal-carrying parts.

One method of the present invention for accomplishing these goals and requirements comprises as a first step, the application to portions of the module 39 an adhesive-precoated plastic film to form a substantially continuous, conformable first layer 48, including an electrically insulating material. For example, a plastic sheet, or film may be pre-punched, and vacuum molded directly onto the module 39 by using conventional vacuum-pack molding techniques to achieve the desired tight conformance with the surface profile of the substrate 40 and devices 41. The finished thickness of the first layer 48 is typically 0.010 to 0.020 inch. A suitable film is "FR65," obtainable from TEKRA Corporation, New Berlin, Wis.

Thereafter, as a second step, a substantially continuous second layer 50, comprising a thermally conductive material, is applied over the first layer 48. The second layer 50 may be applied by any suitable conventional technique. For example, the thermally conductive layer 50 may include a coating of zinc or copper deposited by air-based, or electric, arc-spraying techniques onto the first layer 48 using a, for example, "TAFA 8830" arc-spraying system, obtainable from TAFA Incorporated, Bow, NH. The finished thickness of the second layer is approximately in the range of 0.005 inch to 0.030 inch. The second layer 50 increases the thermally conductive area of the module 39 and assists in drawing heat away from localized hot spots and spreading it over the entire surface of the module 39.

As an optional step of the method according to the present invention, surface-expanding elements, such as fins 49 may be mounted adhesively on the first layer 48, at locations where the layer 48 covers devices 41 particularly sensitive to excessive heat. The surface-expanding elements can be formed of, for example, molded plastic, polycarbonate, or extruded aluminum.

Figure 6:
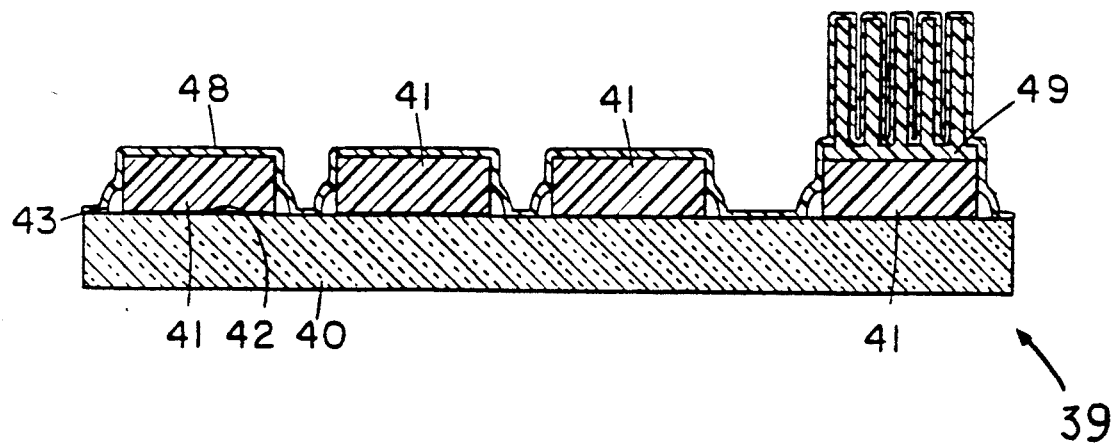
FIG. 6 is a cross-section of an electronic module having a single thermally conductive layer coated thereon according to an alternative embodiment of the present invention.

In an alternative embodiment, as shown in FIG. 6, the first layer 48 is made of a dielectric material that is thermally conductive, for example, a spray-on glassy metal or synthetic diamond, thus eliminating the need for an insulating layer. In this case, the surface-expanding element 49, if used, is mounted directly on the device 41 that is particularly sensitive to heat.

Although the above description has proceeded with reference to an apparatus and method for cooling a mass-produced disposable electronic module, it is to be understood that the apparatus and method as is disclosed herein may be adapted to a wide variety of cooling systems, where there is a need to provide cooling for heat generating devices presenting an irregular surface profile, including electronic modules with heat generating devices mounted on both sides of a substrate. Therefore the invention is not necessarily limited to the particular embodiment shown herein. It is to be understood that various other adaptations and modifications may be made within the spirit and scope of this invention which is indicated by the following claims.

What is claimed is:

1. The method of making a cooling apparatus for cooling an electronic module having heat generating devices mounted on a surface of a substrate comprising the steps of:
   (a) applying a substantially continuous, conformable, permanent first layer formed of an electrically insulating material to said surface of said substrate and said devices to a thickness to reliably cover protruding electrically conductive features of said surface and said devices;
   (b) mounting surface-expanding elements on said first layer; and
   (c) applying a substantially continuous, thermally conductive, permanent and solid second layer on said permanent first layer and said surface-expanding elements to cool said devices during operation.

2. An electronic assembly comprising:
   an electronic module permanently coated at least in part by an electrically insulating first layer of a thickness sufficient to reliably cover protruding features of electrical components carried on the module;
   a surface-expanding element mounted on said first layer; and a substantial continuous thermally conductive and solid second layer permanently formed on said first layer and said surface-expanding element to cool said electrical components during operation.

3. An electronic assembly as in claim 2 wherein said second layer is electrically conductive and said first layer electrically insulates said second layer from said substrate and said components.

* * * * *